United States Patent
Wuu et al.

(10) Patent No.: US 11,205,477 B2
(45) Date of Patent: Dec. 21, 2021

(54) MEMORY WITH EXPANDABLE ROW WIDTH

(71) Applicant: ADVANCED MICRO DEVICES, INC., Santa Clara, CA (US)

(72) Inventors: John Wuu, Fort Collins, CO (US); Martin Paul Piorkowski, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/996,024

(22) Filed: Aug. 18, 2020

(65) Prior Publication Data

US 2021/0043250 A1 Feb. 11, 2021

Related U.S. Application Data

(62) Division of application No. 15/830,176, filed on Dec. 4, 2017, now Pat. No. 10,783,953.

(51) Int. Cl.
*G11C 11/419* (2006.01)
*G11C 11/418* (2006.01)
*G11C 7/12* (2006.01)

(52) U.S. Cl.
CPC .............. *G11C 11/419* (2013.01); *G11C 7/12* (2013.01); *G11C 11/418* (2013.01)

(58) Field of Classification Search
CPC ................................ G11C 11/419; G11C 7/12
USPC ......................................................... 365/154
See application file for complete search history.

(56) References Cited

U.S. PATENT DOCUMENTS

| | | | | |
|---|---|---|---|---|
| 5,440,715 A | * | 8/1995 | Wyland | G06F 16/90339 711/108 |
| 6,687,785 B1 | * | 2/2004 | Pereira | G11C 15/00 365/49.18 |
| 6,934,795 B2 | * | 8/2005 | Nataraj | G11C 8/04 711/108 |
| 7,408,828 B1 | * | 8/2008 | Casper | G11C 11/406 365/149 |
| 7,924,589 B1 | * | 4/2011 | Srinivasan | G11C 29/846 365/49.17 |
| 2002/0075714 A1 | * | 6/2002 | Pereira | G11C 15/04 365/49.1 |
| 2006/0274587 A1 | * | 12/2006 | Houston | G11C 7/12 365/203 |
| 2010/0082881 A1 | * | 4/2010 | Klein | G06F 13/14 711/103 |

\* cited by examiner

*Primary Examiner* — Muna A Techane

(57) ABSTRACT

A method for operating a memory device includes initiating an access operation to a corresponding row of an array of bit cells of the memory device. Responsive to an expansion mode signal having a first state, the method further includes dynamically operating each column of a plurality of columns of the array to access each bit cell of a corresponding row within the plurality of columns during the access operation. Alternatively, responsive to the expansion mode state signal having a second state different than the first state, the method includes dynamically operating each column of a first subset of columns of the plurality of columns to access each bit cell of a corresponding row within the first subset of columns during the access operation, and maintaining each column of a second subset of columns of the plurality of columns in a static state during the access operation.

20 Claims, 6 Drawing Sheets

MEMORY WITH EXPANDABLE ROW WIDTH

CROSS-REFERENCE TO RELATED APPLICATIONS

The present application is a divisional application of U.S. patent application Ser. No. 15/830,176, entitled "MEMORY WITH EXPANDABLE ROW WIDTH", and filed on Dec. 4, 2017, the entirety of which is incorporated by reference herein.

BACKGROUND

Static random access memory (SRAM) and other types of memory typically are implemented as one or more arrays of bit cells, with the bit cells of each array arranged in rows and columns. The bit cells of a row in an array typically are configured to store a block of data (e.g., a word of data or double-word of data) and error correcting code (ECC), parity, status information or other metadata associated with that block of data, such that a certain number of bit cell columns in that row are used for storing corresponding bits of the data block, while other bit cell columns in that row are used for storing the corresponding bits of the metadata for that data block.

A device provider or supplier may intend a particular memory-implementing device to be implementable in a variety of different system configurations. However, these different system configurations may have different requirements regarding one or both of the size of data blocks stored at the memory or the type or amount of metadata stored with each data block. To illustrate, one system configuration may be designed for a 96-bit data block, whereas another system configuration may be designed for a 128-bit data block. As another example, one system configuration may utilize ECC, whereas another system configuration may not incorporate ECC into its operations. Often, such memory configuration variations lead to the design and provision of separate memory designs for each expected implementation, or even to the design and provision of separate system on a chip (SoC) designs for each expected SoC implementation. However, developing different variations of the same basic memory design to accommodate different data widths or metadata capabilities is resource-intensive and thus often impracticable.

To avoid the need to have multiple design variations for different configurations or markets, some conventional memory designs include the maximum number of bit cell columns needed to support the largest data block/metadata use case, and then employ masks that effectively mask off the values of bits read from bit cell columns not used for a particular configuration that requires a narrower data block or fewer bits of metadata. To illustrate, a memory design may have 128 bit cell columns to support a 128-bit data block, but for those design configurations using, for example, only 96 bits per data block, the memory used in such design configurations would employ a mask to mask the read output of the unused 32 columns of bit cells. However, while providing design flexibility, such masks only mask off whatever values are read from such bit cells, and do not effectively disable the unused bit cells. As such, the bit cells in masked-off columns remain active and thus consume considerable dynamic power during memory access operations.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
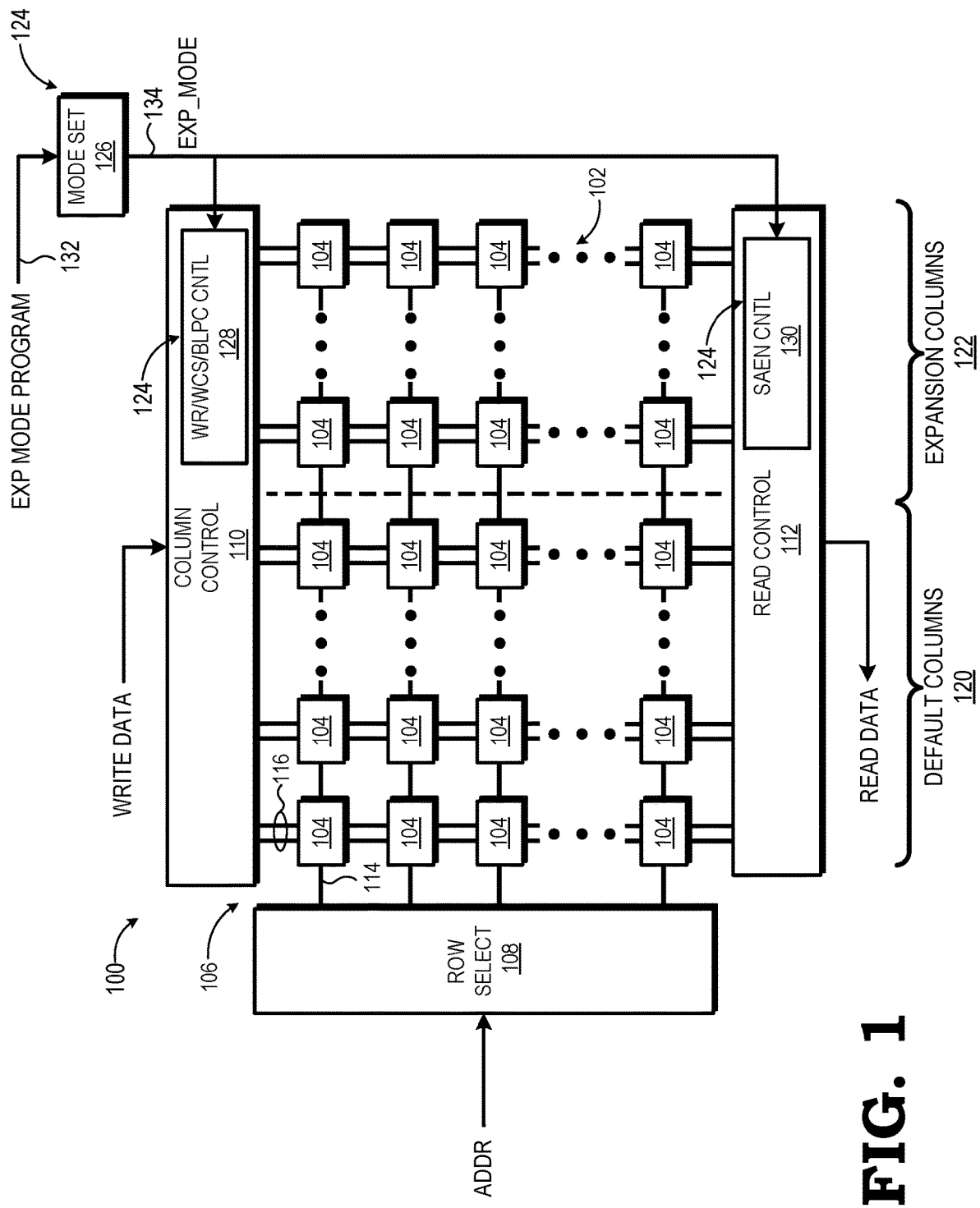
FIG. 1 is a block diagram illustrating a memory device employing a bit cell array with an expandable column width in accordance with some embodiments.

Providing a single memory design that accommodates different data block widths or different metadata usages results in columns of bit cells of an array being unutilized for implementations that require less than the maximum data block width or less than the maximum metadata usage provided by a memory design. Disclosed herein are systems and techniques for reducing or eliminating the power consumption of such unutilized bit cell columns while facilitating the memory design to be usable in a variety of implementations. In at least one embodiment, a memory device includes an array of bit cells and corresponding access components used to access the array of bit cells during access operations. The array of bit cells is arranged into a plurality of rows and a plurality of columns. The plurality of columns has a first subset of columns that acts as the default, or minimum, data block width and/or metadata "width" for the memory device. The plurality of columns further includes one or more additional second subsets of columns, each second subset of columns acting as an "expansion" data set that may be used to expand the data block width and/or metadata width for a given implementation. The SoC or other implementing such a memory design thus may be operated in one of a plurality of modes, including a default mode in which none of the expansion data sets are activated for dynamic operation, or one or more expansion modes in which one or more expansion data sets are activated for dynamic operation (that is, to store valid bits and provide access thereto).

When an expansion data set is activated for dynamic operation through activation of a corresponding expansion mode, the memory-implementing device operates the second subset of bit cell columns associated with that expansion data set in a conventional manner (that is, in the same manner as the first set of bit cell columns) such that the bit cells of the second subset of bit cell columns may be accessed for read and write memory access operations as is known in the art. However, when an expansion data set is disabled through deactivation of the corresponding expansion mode, the access components of the memory device operate so as to hold the bit cells of the corresponding second subset of bit cell columns in a static state during memory accesses to corresponding rows of the array. These bit cell columns may be configured or otherwise held in a static state through control of the signaling provided to these columns and through control of the access components used to access these columns. Examples of such include, but are not limited to, disabling precharging of the bit lines for the columns of the second subset, configuring the write drivers to drive a specified opposite logic value pair on the bit lines of the bit line pairs, disabling the sense amplifiers, and the like. By maintaining the bit cell columns in a static state for an unused expansion data set, the bit cells of these bit columns and the circuitry of the memory device used to access these bit cells are configured to draw relatively little dynamic power. This allows the memory device or SoC implementing such a memory design to be utilized in configurations that use less than the full data block width or metadata width without paying a power consumption penalty for the unused width capacity.

FIG. 1 illustrates a memory device 100 that provides multiple row width configurations with reduced power consumption in accordance with some embodiments. The memory device 100 includes an array 102 of bit cells 104, wherein the bit cells 104 are arranged in N columns and M rows (N, M being integers greater than zero). For purposes of illustration, the memory device 100 is implemented as a static random access memory (SRAM) and the bit cells 104 thus are SRAM bit cells using any of a variety of SRAM cell architectures, such as one of the six-transistor (6T) or eight transistor (8T) bit cell architectures known in the art. Although one array 102 is illustrated, it will be appreciated that in implementation the memory device 100 typically would include a number of such arrays 102. The memory device 100 may be implemented as, for example, part of a system on a chip (SoC) or other larger electronic component or system.

The memory device 100 further includes access components 106 to access and otherwise control the bit cells 104 of the array 102 during access operations. The access components 106 include a row select component 108 (also frequently referred to as "address decode logic"), a column control component 110, and a read control component 112. As a general summary of their operation during a read access, write access, or other access operations, the row select component 108 operates to decode an address ("ADDR") provided with the access operation to determine the corresponding row of the array 102, and to activate the corresponding word line pair for that row. Concurrently, the column control component 110 operates to activate the bit cells 104 of the corresponding column by enabling bit line precharge circuitry of the column control component 110 to precharge the bit line pairs. Further, if the access operation is a write operation, activating write column select (WCS) circuitry to select the appropriate columns of the array 102 and configuring write drivers of the column control component 110 to drive the bit lines of each bit line pair 116 with a pair of logic values in accordance with the corresponding bit values of the data ("WRITE DATA") to be written to the accessed row. If the access operation is a read operation, then the read control component 112 enables its sense amplifiers to sense the voltages on the bit line pairs 116 of the columns and thus sense the bit value store in the bit cells of the activated row, and provide these sensed bit values as the read data ("READ DATA") for the read operation.

In at least one embodiment, the memory device 100 is of a design that is intended to support a number of markets or implementations regarding the "width" of the rows of the array. To illustrate, in one example embodiment the array 102 has 156 columns, and thus has a maximum row width of 156 bits. In one market, the memory device 100 may be implemented in a system on a chip (SoC) which utilizes 128 bits of the row width for storing a 128-bit data block, and use the other 28 bits for ECC for the data block (one embodiment of metadata). Such an implementation would thus use the entire row width capacity. However, another SoC may utilize the memory device 100 to store 128-bit data blocks, but may not implement ECC, and thus leave the other 28 bits unused. As another example, an SoC may utilize a 96-bit data block and 28 bits of ECC, parity, and status bits (other examples of metadata) and thus leave 32 bits of the maximum row width of 156 bits unused. While data masks could be used to prevent the unused bit columns from being improperly provided as valid data, the bit cells in these unused columns would continue to consume considerable dynamic power during memory access operations, and thus the latter two examples would pay a power penalty for unused row width capacity.

To more fully facilitate an adaptable or expandable design, in at least one embodiment the memory device 100 employs a default data set and one or more expansion data sets, with the expansion data sets configurable to reduce or eliminate dynamic power consumption when not in use for a particular implementation. Thus, the memory device 100 may be configured to one of multiple row width configurations without incurring a power penalty when using less than the full row width capacity. To this end, in at least one embodiment the memory device 100 logically divides the N columns of the array 102 into a first subset of columns, referred to herein as the default subset 120 or, alternatively, the default data width 120, and one or more second subsets of columns, referred to herein as the expansion subsets 122, or alternatively, expansion data sets 122. For ease of illustration, FIG. 1 depicts only a single expansion subset 122, but in other embodiments multiple expansion subsets may be employed using the guidelines and teachings provided herein. Further, for ease of reference, bit cell columns of the array 102 that are included in the default data set 120 are referred to herein as "default columns", whereas bit cell columns of the array 102 that are included in an expansion data set 122 are referred to herein as "expansion columns."

The default columns of the default data set 120 operate in a conventional manner regardless of the expansion mode or configuration of the memory device 100. As such, the number of columns in the default data set 120 specify the default, or minimum, width of the rows of the array 102. To illustrate, if it is determined that the minimum row width to be supported by the memory device 100 is 76 bits, then the first 76 columns of the M columns of the array 102 would be configured as the default data set 120. In contrast, the operation of the bit cell columns of the expansion data set 122 depends on whether the expansion mode is enabled or disabled. When the expansion mode for the expansion data set 122 is enabled, the columns of expansion data set 122 are operated in the same manner as the columns of the default data set 120 such that when a row of the array 102 is accessed, the bit cells along that row in both the columns of the default data set 120 and expansion columns of the expansion data set 122 are read from or written to, in accordance with the access operation. Conversely, when the expansion mode for the expansion data set 122 is disabled, the access components 106 are configured to hold the expansion columns of the expansion data set 122 in the same static state for each access operation so that the bit cells and associated signaling components in the memory device 100 for the expansion columns consume relatively little or no dynamic power during the access operations.

In at least one embodiment, operation of the access components 106 with respect to the expansion columns of an expansion data set 122 is configured or controlled by an expansion control component 124. In the example embodiment of FIG. 1, the expansion control component 124 includes a mode set component 126, components for write driver, write column select (WCS), and bit line precharge (BLPC) control (collectively represented in FIG. 1 by component 128), and a sense amplifier enable (SAEN) control component 130. Additional details regarding embodiments of these components are described subsequently with reference to FIGS. 2 and 5-8.

The mode set component 126, in one embodiment, includes an input to receive an expansion mode program signal 132 comprising a signal indicating a mode to be implemented by the memory device 100, a storage component or buffer (not shown) to store a value representing that signal, and one or more signal drivers to output an expansion mode signal 134 ("EXP_MODE") for use by the other sub-components of the expansion control component 126. To illustrate, in one embodiment, the memory device 100 is implemented as part of an SoC, and the expansion mode program signal 132 is provided by a device implementing the SoC as a voltage or logic value applied to an external pin of the SoC, whereupon the supplied signal is buffered at an I/O buffer of the SoC and the corresponding expansion mode signal 134 transmitted from this buffer. Alternatively, the expansion mode program signal 132 may be provided by another component of the SoC. In other embodiments, the mode set component 126 may be implemented as, for example, a one-time-programmable (OTP) memory or other programmable storage component, fuse, or anti-fuse that is set or programmed to a permanent mode upon fabrication or system integration, as a register or programmable logic that may be set and reset multiple times, and the like.

The expansion mode program signal 132 and the expansion mode signal 134 can be implemented in any of a variety of ways. In implementations in which the memory device 100 implements a single expansion data set, and thus employs only two modes: a default mode (i.e., expansion mode disabled) and an expansion activated mode, the signals 132 and 134 each may be implemented as a single bit/binary logic value pair, wherein one bit value/logic level indicates activation of the expansion mode, and the other bit value/logic level indicates deactivation of the expansion mode. In the event that there are multiple expansion data sets 122 to provide multiple expanded data width options, each expansion data set 122 may be represented by a corresponding multiple bit vector representing the expansion mode signal 134. For ease of reference, the convention used herein is as follows: a bit value of "1" for the expansion mode signal 134 (that is, EXP_MODE=1) indicates that the expansion mode is activated, whereas a bit value of "0" for the expansion mode signal 134 (that is, EXP_MODE=0" indicates that the expansion mode is disabled. Further, as illustrated below with reference to FIGS. 5-8, in some embodiments, the inverted complement of the expansion mode signal 134 is used in addition to, or instead of, the expansion mode signal 134 itself. In such instances, mode set component 126 may include an inverter or other circuitry to generate the inverted complement of the expansion mode signal 134 (referred to herein as "EXP_MODE_B").

Figure 2:
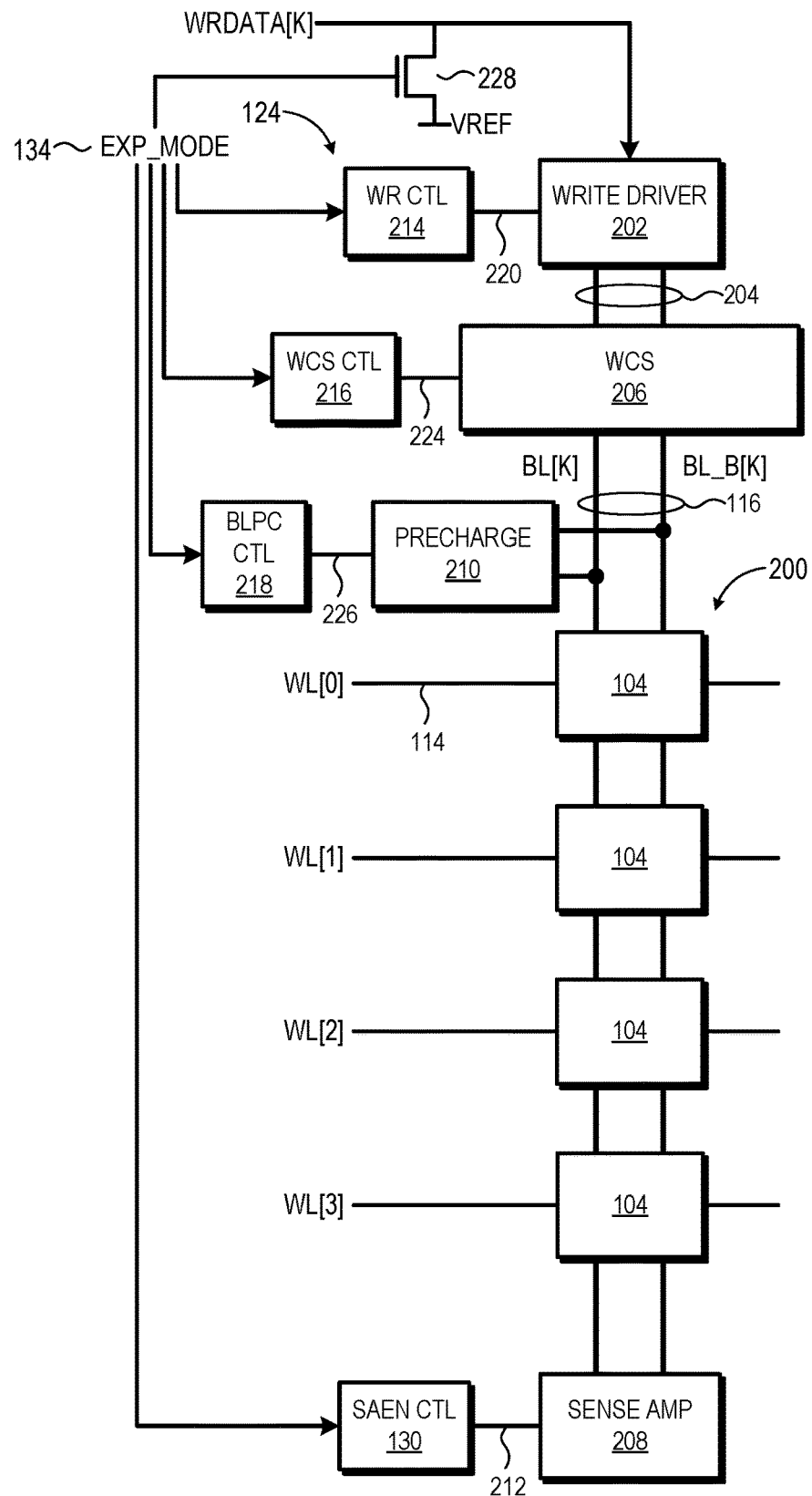
FIG. 2 is a block diagram illustrating an expansion bit cell column of the memory device of FIG. 1 in accordance with some embodiments.

FIG. 2 illustrates the expansion control component 124 in more detail in accordance with some embodiments. In the depicted example, a general summary of the operation of components 128 and 130 is shown with reference to a single expansion column 200 of the expansion data set 122, which has four rows, and thus four bit cells 104 (note that in implementation, the column 200 typically would have a greater number of rows). While only one expansion column 200 is shown, it will be appreciated that the expansion control component 124 operates in the same manner with respect to the other expansion columns 200 of the expansion data set 122.

Each bit cell 104 of the expansion column 200 is coupled to the bit line pair 116 associated with the column and to the word line 114 associated with the row in which the bit cell 104 is located. As there are four rows in this example, there are four word lines 114, denoted WL[0]-WL[3]. The bit line pair 116 is implemented to transmit a differential signal to the bit cells 104 of the column 200, with one bit line ("BL[0]") carrying one voltage level or logic level, and the other bit line ("BL_B[0]") carrying its complement. Thus, the voltage/logic pair carried by the bit line pair 116 determines the bit value to be stored to, or written to, the bit cell of the column 200. Accordingly, during a write operation that involves the column 200 in an activated state, a write driver 202 outputs a corresponding pair of complementary voltages onto output line pair 204 that represent the bit ("WRDATA[K]") to be written to the bit cell 104 at that row in column 200 (at position K in the array 102), and a write column select (WCS) component 206 is configured to couple the output line pair 204 to the corresponding bit lines of the bit line pair 116 of the column 200, and the bit cell 104 associated with the activated word line 114 is thus configured to store the value indicated by the complementary voltage pair output by the write driver 202. Similarly, during a read access that includes an activated column 200, the word line 114 associated with an address of the read access is activated, and bit cell 104 associated with that activated word line 114 configures the bit lines of the bit line pair 116 to reflect the bit value stored at that bit cell 104. A sense amplifier 208 is coupled to the bit line pair 116 via a row column select (not shown) circuit, and outputs a bit value representing the particular voltage pair sensed on the bit line pair 116. Further, for both write and read accesses, the column control component 110 employs a precharge component 210 to precharge the bit line pair 116 to facilitate the read or write operation, as is well known in the art.

The dynamic operation of the write driver 202, the precharge component 210, and the sense amplifier 208 to write to or read from the bit cells 104 of the column 200 consume considerable current, and thus power. Accordingly, when the column 200 is not activated for use (that is, the expansion mode is set to "expansion disabled" or EXP_MODE=0) the expansion control component 124 employs various circuits to control the operations of these memory components such that the bit cells 104 of the column 200 are maintained in a substantially static state for the access operations occurring to the array 102 while in this mode. In particular, the expansion control component 124 includes the SAEN control component 130 having an input to receive the expansion mode signal 134 (or its complement) and an output to provide a SAEN signal 212 based on the mode represented by the expansion mode signal 134, whereby the SAEN signal 212 is an enable signal that enables or disables the sense amplifier 208 depending on its state.

The expansion control component 124 further includes a write control component 214, a WCS control component 216, and a BLPC control component 218. The write control component 214 includes an input to receive the expansion mode signal 134 (or its complement) and an output to provide write driver configuration signal 220 based on the mode represented by the expansion mode signal 134, whereby the write driver configuration signal 220, when asserted, configures the write driver 202 to output a specified logic level on both bit lines of a corresponding bit line pair 116, as described below. The WCS control component 216 includes an input to receive the expansion mode signal 134 (or its complement) and an output to provide WCS configuration signal 224 based on the mode represented by the expansion mode signal 134, whereby the WCS configuration signal 224, when asserted, configures the WCS component 206 to connect the output line pair 204 to the bit line pair 116, as described below. The BLPC control component 218 includes an input to receive the expansion mode signal 134 (or its complement) and an output to provide a BPLC enable signal 226 based on the mode represented by the expansion mode signal 134, whereby the BLPC enable signal 226 enables or disables the precharge component 210 depending on its state. Further, the memory device 100 includes circuitry (represented by transistor 228) to pull the input to the write driver 202 to a known state or voltage reference ("VREF") while in the default mode. Note that while FIG. 2 depicts components 214, 216, 218, and 130 separate from the write driver 202, the write column select component 206, the precharge component 210, and the sense amplifier 208, respectively, in some embodiments some or all of the components 214, 216, 218, and 130 are integrated with the corresponding component, rather than as logic and circuitry discrete from the corresponding component.

Figure 3:
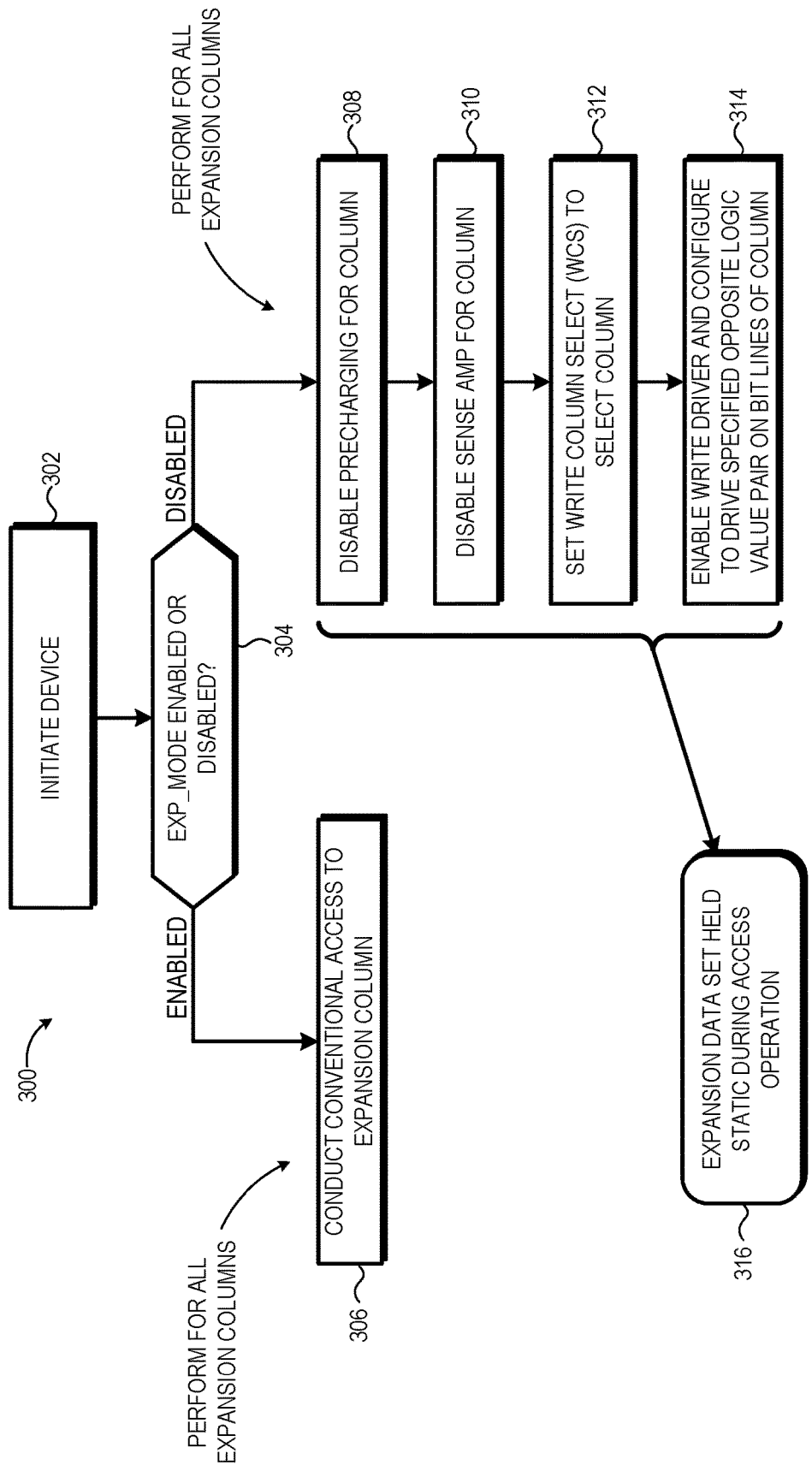
FIG. 3 is a flow diagram illustrating a method of operation of the memory device of FIG. 1 in accordance with some embodiments.

FIG. 3 illustrates a method 300 of operation of the memory device 100 in accordance with some embodiments. The method 300 is described with reference to the example implementation of the expansion control component 124 and the expansion column 200 of FIG. 2. The method 300 initiates at block 302 with the initialization of the memory device 100, either as a component of an SoC being initialized, or initialization as a discrete device. During initialization, an internal component or external device programs the memory device 100 to operate in either the default mode or in an expansion mode via the expansion mode program signal 132. Accordingly, at block 304 the mode set component 126 determines the state of the expansion mode program signal 132 and sets the expansion mode signal 134 (and, in some implementations, its complement signal) to represent the expansion mode indicated by the expansion mode program signal 132. As noted above, this determination of expansion mode is made by, for example, checking the state of an external pin, an OTP memory, a fuse, an anti-fuse, a register, and the like. In the event that the indicated mode is "expansion mode activated", the expansion mode signal 134 is set to logic high or "1", and otherwise set to logic low or "0".

In the event that the expansion mode is enabled (EXP_MODE=1), then at block 306 the expansion control component 124 configures the access components of the memory device 100 to operate in a conventional manner (that is, to permit dynamic access during access operations) with respect to the expansion columns 200 of the expansion data set 122. In particular, the write control component 214 deasserts the write driver configuration signal 220, thereby permitting the write driver 202 to drive a voltage/logic value pair representative of the incoming bit value WRDATA[K] during a write access, and the write column select control component 216 deasserts the WCS configuration signal 224, thereby allowing the write column select component 206 to select the appropriate column/array based on an array select signal. Further, the BLPC control component 218 asserts the BLPC enable signal 226, thereby permitting the precharge component 210 to precharge the bit line pair 116 in anticipation of a read or write access. Similarly, the SAEN control component 130 asserts the SAEN enable signal 212 to permit activation of the sense amplifier 208 during read accesses. As such, the control signaling and other inputs to the bit cells 104 of the expansion column 200 may be dynamically operated during access operations to the array 102, and thus permit data or metadata to be dynamically stored to, and read from, the bit cells 104 of the expansion columns 200 of the expansion data set 122.

Returning to block 304, if the mode set component 126 instead determines that the expansion mode is disabled (EXP_MODE=0), then the expansion control component 124 operates to maintain the bit cells 104 of the expansion columns 200 in a substantially static state during access operations so as to reduce the power consumed by the expansion columns 200 in their unused state. This static hold process, in one embodiment, includes the BLPC control component 218 deasserting the BLPC enable signal 226, which in turn disables the precharge component 210, and thus prevents the precharge component 210 from precharging the bit line pair 116 of the expansion column during any access operations to the array 102. Further, at block 310 the SAEN control component 130 deasserts the SAEN signal 212, and thus disabling the sense amplifier 208 for the expansion column 200. Moreover, at block 312 the WCS control component 216 asserts the WCS configuration signal 224, and thereby configuring the WCS component 206 to couple the output of the write driver 202 to the bit line pair 116 of the expansion column 200, and at block 314 the write driver control component 214 asserts the write driver configuration signal 220 so as to configure the write driver 202 to output a specified opposite logic value pair on the bit lines of the bit line pair 116 regardless of the value of the EXP[0] bit input to the write driver 202. Note that while illustrated in a particular order in FIG. 3 for ease of discussion, the processes of blocks 308, 310, 312, 314, in one embodiment, are performed in parallel, and in other embodiments where some or all of the processes are performed sequentially, the sequence may be the same as, or different, from that shown in FIG. 3. Also note that the process represented by blocks 308, 310, 312, 314 is performed in parallel for each expansion column 200 of the expansion data set 122.

As represented by block 316, the combination of one or more of the processes of disabling precharging, disabling the sense amplifier 208, and forcing the write driver 202 to output a specified opposite logic value pair while in the default/non-expansion mode results in the bit cells 104 and associated access components for the expansion column 200 being held in a relatively static state during access operations to the array 102, and thus reducing or eliminating the power consumption resulting from the otherwise dynamic operation of these components when not in use for data storage.

Figure 4:
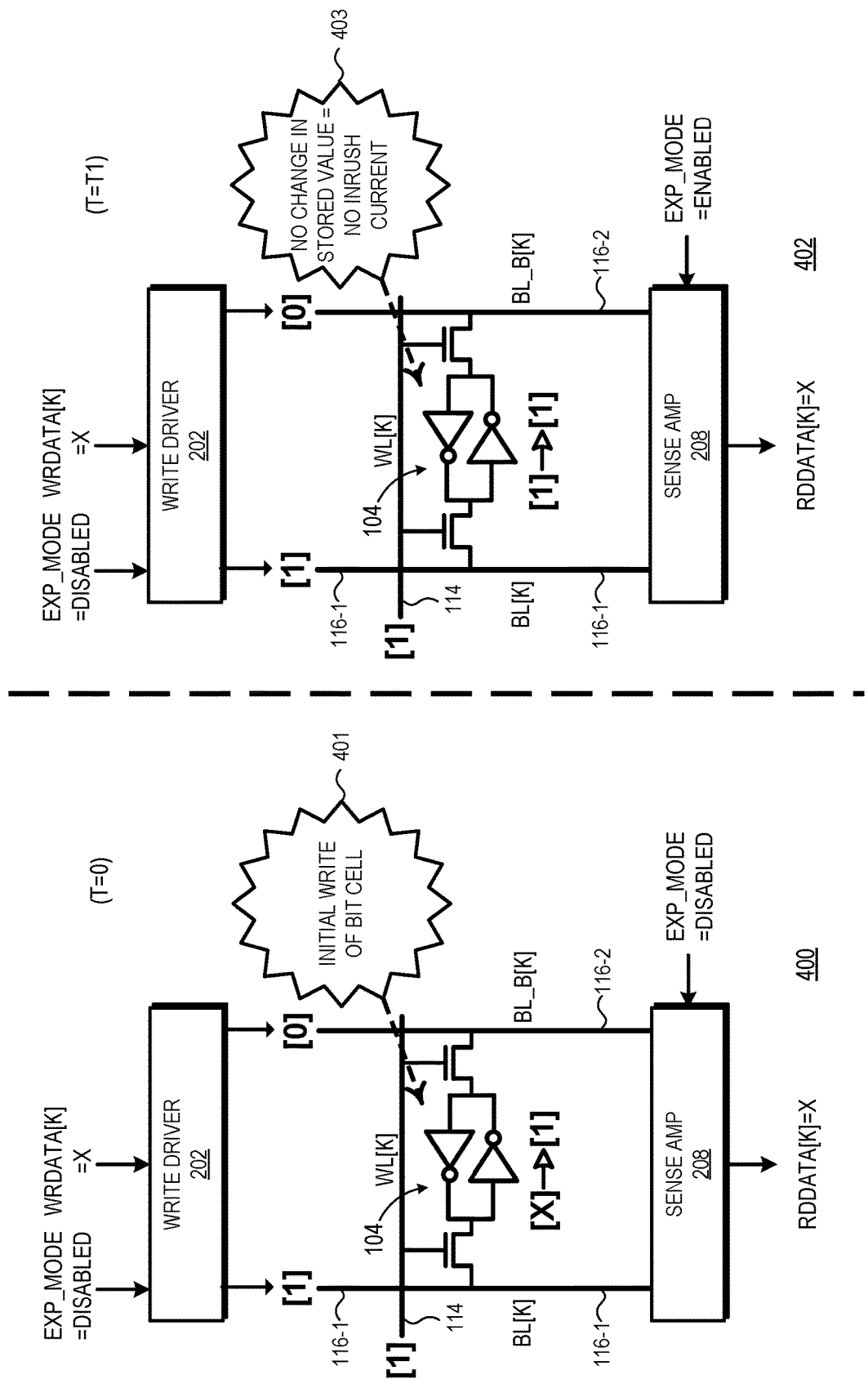
FIG. 4 is a diagram illustrating a low dynamic power consumption operation of a bit cell of a disabled expansion bit cell column in accordance with some embodiments.

FIG. 4 illustrates this aspect by way of a simplified example involving a single bit cell 104 of the expansion column 200. In this example, the bit cell 104 is implemented as a typical 6T SRAM cell, but the described power-savings principles apply equally to other SRAM cell formats. As explained above, in an enabled expansion mode, during a write operation the write driver 202 for the expansion column 200 is configured to output a specified logic value pair to the bit line pair 116, the logic value pair representing the logic value to be stored to the bit cell 104. To illustrate, the write driver 202 could drive a logic "1" to the bit line 116-1 and the complement logic "0" to the complement bit line 116-2, which in this example would represent the operation to store a logic "1" during a write operation, and drive a logic "0" and a logic "1" to the bit lines 116-1, 116-2, respectively, during a write operation to store a value 0.

However, as noted above, when the expansion data set 122 is disabled, the write control component 214 configures the write driver 202 to output a specified opposite logic value pair on the bit lines 116-1, 116-2 while the expansion data set 122 is disabled. For purposes of this example, driving the specified opposite logic value pair includes driving a logic "1" (or its voltage equivalent) on bit line 116-1 while driving a logic "0" (or its voltage equivalent) on bit line 116-2, although in other embodiments these logic values may be reversed with respect to the bit lines 116-1, 116-2. Thus, as illustrated by view 400 of FIG. 4, the first time an access operation is performed involving the row containing the bit cell 104 of FIG. 4 (at time T=0), the assertion of the write line 114 for the row and the write driver 202 driving the logic value pair "1, 0" on bit lines 116-1, 116-2, respectively, results in the bit cell 104 being programmed to a logic value "1" in this example (as reflected by note 401). Depending on the state of the bit cell 104 during this first access operation, there may be some amount of inrush current involved in the programming of the bit cell 104 to the logic value "1".

However, as reflected by view 402, for all subsequent access operations to the row while the expansion data set 122 is enabled (e.g., at time T=T1), when the write line 114 is activated and the write driver 202 maintains the bit lines 116-1, 116-2 in the same specified "1,0" opposite logic value state as applied during the initial access operation, the bit cell 104 is already programmed to the logic value "1", and thus the bit lines 116-1, 116-2, in effect, attempt to write a logic value "1" to the bit cell 104 which already stores a logic value "1". As reflected by note 403, this operation to write the same logic value already stored in the bit cell 104 does not consume dynamic power, and thus maintaining this static state for the bit cell 104 by setting the bit lines 116-1, 116-2 to maintain the same opposite logic value pair while the expansion data set 122 is disabled avoids the inrush current that otherwise would be incurred to reprogram the bit cell 104 to another value.

Moreover, recall that at block 308 (FIG. 3) precharging of the bit line pair 116 is disabled, and thus avoiding the considerable current that otherwise would be required for precharging the bit line pair 116 during an access operation to the array 102. Similarly, as illustrated by block 310 (FIG. 3), in some embodiments the sense amplifier 208 is disabled, thereby reducing or eliminating the power that otherwise would be consumed by the sense amplifier 208 during read accesses to the array 102, as well as avoiding spurious, inaccurate data outputs by the sense amplifier 208 when the expansion column 200 is not in use.

FIGS. 5-8 illustrate example circuit implementations for various components of the expansion control component 124 in accordance with some embodiments. For purposes of comparison, these circuit implementations also include the circuitry used to output the corresponding control signals for a bit cell column of the default data set 120. For naming purposes, those signals output for a bit cell column of the default data set 120 are denoted with the suffix "_DFT", while those output for an expansion column of the expansion data set 122 are denoted with the suffix "_EXP". Moreover, a suffix "_B" is used to denote a signal that is the inverted representation of a corresponding signal.

Figure 5:
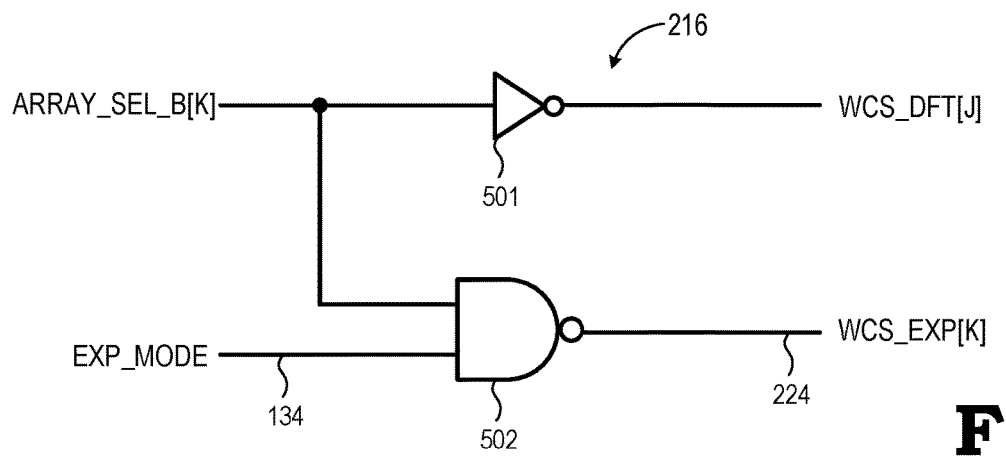
FIG. 5 is a diagram illustrating an implementation of a write column select control circuit in accordance with some embodiments.

FIG. 5 illustrates an example circuit implementation for the WCS control component 216 in accordance with some embodiments. In this embodiment, the WCS control component 216 includes an inverter 501 and a NAND gate 502. The inverter 501 has an input to receive an inverted representation of an array select signal (identified as ARRAY_SEL_B[K]" and an output to provide an WCS control signal (WCS_DFT[J]) to the corresponding column of the default data set 120 at position Y. The NAND gate 502 has one input to receive the signal ARRAY_SEL_B[K], an input to receive the expansion mode signal 134 (EXP_MODE) and an output to provide the WCS configuration signal 224 ("WCS_CTL[K]") for the expansion column 200 at position X. With this configuration, whenever the expansion mode signal 134 is set to "0" (that is, expansion mode disabled), then the WCS configuration signal 224 is asserted (that is, WSC_EXP=0), and thus configuring the WCS component 206 as described above. Likewise, the WCS control signal WCS_DFT[Y] is set to the non-inverted value of the array select signal for the default columns regardless of the expansion mode (albeit with synchronized timing provided by the inverter 501).

Figure 6:
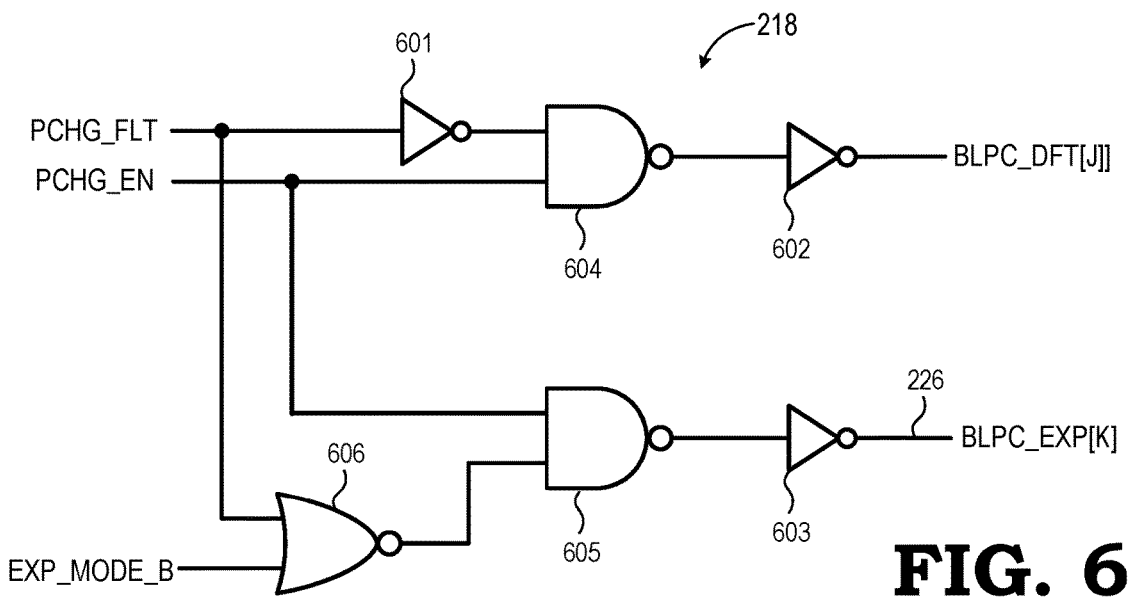
FIG. 6 is a diagram illustrating an implementation of a bit line precharge control circuit in accordance with some embodiments.

FIG. 6 illustrates an example circuit implementation for the BLPC control component 218. In this embodiment, the BLPC control component 218 includes inverters 601, 602, 603, NAND gates 604, 605, and NOR gate 606. The inverter 601 includes an input to receive a signal PCHG_FLT that is asserted when the precharge circuitry is permitted to float (e.g., between access operations), and an output coupled to an input of the NAND gate 604. The other input of the NAND gate 604 receives an initial precharge enable signal PCHG_EN. The output of the NAND gate 604 is connected to an input of the inverter 602, and the output of the inverter 602 provides a precharge control signal BLPC_DFT[J] to the precharge circuitry of the default column at position Y of the default data set. When asserted, the BLPC_DFT[Y] signal directs the precharge circuitry to precharge the bit lines of the default column, and when unasserted, disables the precharge circuitry from precharging the bit lines.

The NOR gate 606 includes an input coupled to receive the PCHG_FLT signal, an input to receive the inverted complement of the expansion mode signal 134 (EXP_MODE_B) and an output coupled to one input of the NAND gate 605. The other input of the NAND gate 605 is coupled to receive the PCHG_EN signal and the output of the NAND gate 605 is connected to the input of the inverter 603. The output of the inverter 603 provides the BLPC enable signal 226. The operation of the NOR gate 606, NAND gate 605, and inverter 603 is such that whenever the expansion mode is disabled (and thus EXP_MODE_B=1), the BPLC enable signal 226 is deasserted, and thus disabling the precharge component 210.

Figure 7:
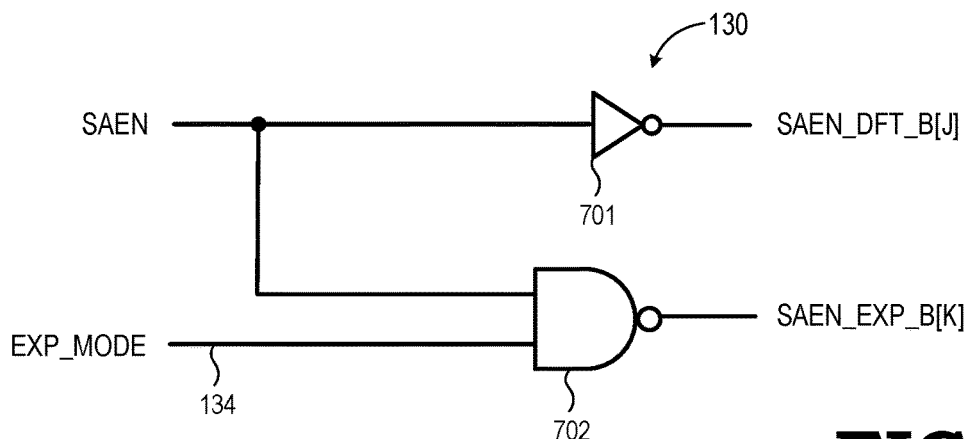
FIG. 7 is a diagram illustrating an implementation of a sense amplifier enable control circuit in accordance with some embodiments.

FIG. 7 illustrates an example circuit implementation for the SAEN control component 130. In this embodiment, the SAEN control component 130 includes an inverter 701 and a NAND gate 702. The NAND gate 702 includes an input to receive an initial SAEN signal ("SAEN"), an input to receive the expansion mode signal 134 (EXP_MODE), and an output to provide an inverted complement of the SAEN enable signal 212 (SAEN_EXP_B[K]) for the sense amplifier 208 of the expansion column 200 at position X. The inverter 701 includes an input to receive the SAEN signal and an output to provide an inverted representation of the SAEN signal (SAEN_DFT_B[J]) to the sense amplifier associated with the default column at position Y. The operation of the NAND gate 702 is such that whenever the expansion mode is disabled (and thus EXP_MODE=0), the signal SAEN_EXP_B[X] is asserted, and thus disabling the sense amplifier 208 for the expansion column 200. Conversely, whenever the expansion mode is enabled (and thus EXP_MODE=0), the signal SAEN_EXP_B[X] is set to the inverted complement of the SAEN signal, and thus allowing the sense amplifier 208 to be enabled or disabled for read and write operations, respectively, in accordance with conventional memory operation.

Figure 8:
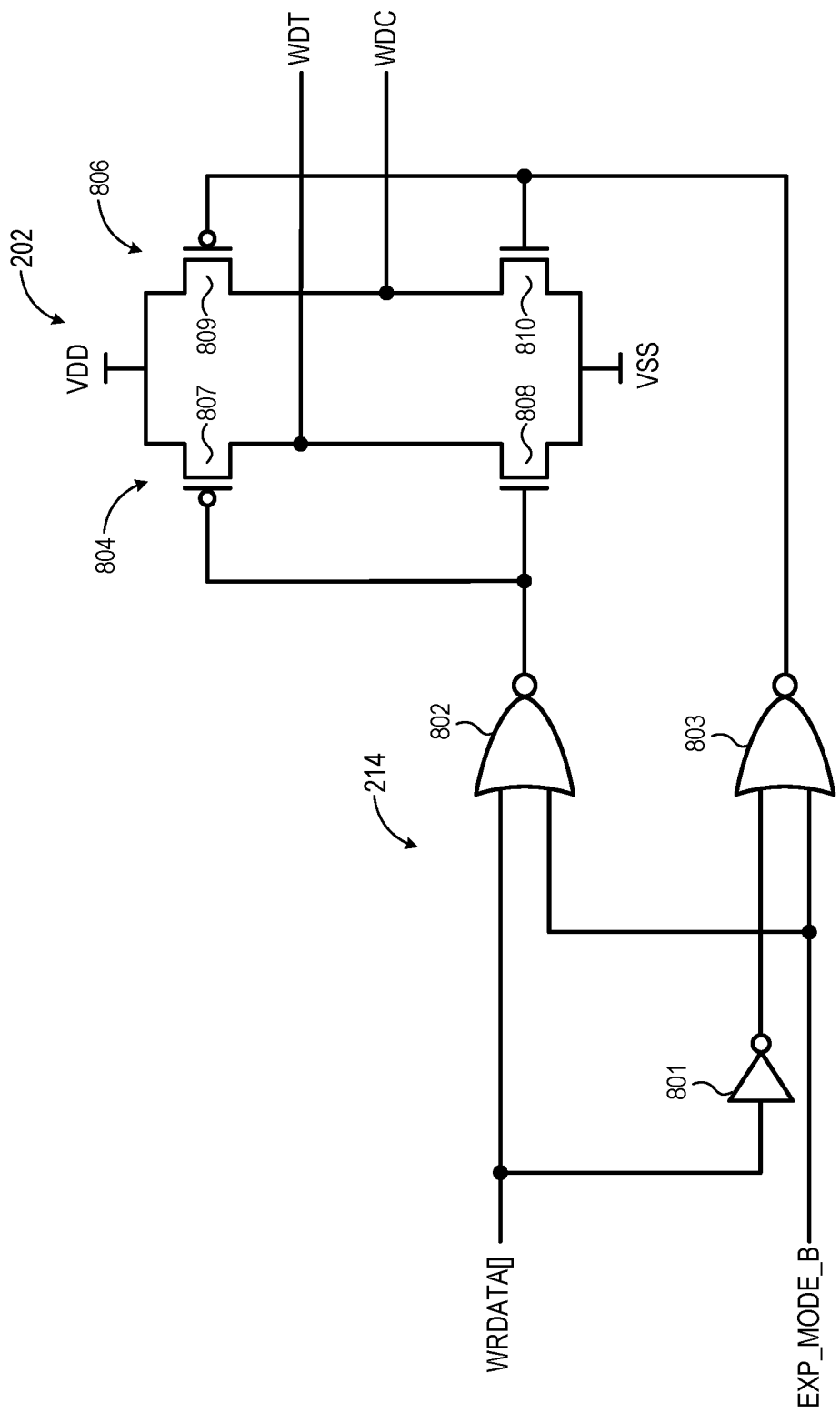
FIG. 8 is a diagram illustrating an implementation of a write driver and a write driver control circuit in accordance with some embodiments.

FIG. 8 illustrates an example circuit implementation for a combination of the write control component 214 and the write driver 202. In the illustrated example, the write control component 214 includes an inverter 801 and NOR gates 802, 803, and the write driver 202 includes driver circuits 804, 806 to drive the bit line 116-1 ("WDT") and the complement bit line 116-2 ("WDC"), respectively. The NOR gate 802 includes an input to receive a write data bit ("WRDATA[ ]") during a write operation and an input to receive the inverted complement of the expansion mode signal 134 (EXP_MODE_B). The output of the NOR gate 802 is connected to the gates of the transistors 807, 808 of the driver circuit 804. The inverter 801 includes an input to receive the write data bit WRDATA[ ] and an output coupled to an input of the NOR gate 803. The other input of the NOR gate 803 is connected to receive the inverted complement signal EXP_MODE_B. The output of the NOR gate 803 is coupled to the gates of the transistors 809, 810 of the driver circuit 806.

In operation, when the expansion mode is enabled (EXP_MODE_B=0), the circuit implementing the write control component 214 operates to control the driver circuit 804 to output the value of WRDATA[ ] as the signal WDT and to control the driver circuit 806 to output the complement of the value of WRDATA[ ] as the signal WDC. However, when the expansion mode is disabled (EXP_MODE_B=1), the circuit implementing the write control component 214 operates to control the driver circuit 804 and the driver circuit 806 to drive opposite logic values regardless of the value of WRDATA[ ], and thus configure the bit lines of the bit line pair 116 to output the same opposite logic value pair while the expansion data set 122 is disabled for use.

In some embodiments, the apparatus and techniques described above are implemented in a system comprising one or more integrated circuit (IC) devices (also referred to as integrated circuit packages or microchips), such as the memory device described above with reference to FIGS. 1-8. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a non-transitory computer readable storage medium accessible to the computing system. Likewise, the code representative of one or more phases of the design or fabrication of an IC device may be stored in and accessed from the same computer readable storage medium or a different computer readable storage medium.

A computer readable storage medium includes any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A memory device comprising:
   an array of bit cells arranged in a plurality of rows and a plurality of columns, the plurality of columns including a first subset of columns and a second subset of columns;
   access components configured to control access to the rows and columns of the array;
   a mode set component to provide an expansion mode signal configurable to represent one of a non-expansion mode and an expansion mode; and
   an expansion control component configured to:
      responsive to the expansion mode signal representing a non-expansion mode, configure the access components to maintain the second subset of columns in a static state while dynamically operating the first subset of columns during an access operation for a row of the array; and responsive to the expansion mode signal representing an expansion mode, configure the access components to dynamically operate both the first subset and the second subset of columns during an access operation for a row of the array.

2. The memory device of claim 1, wherein:
the access components include a write driver associated with a select column of the second subset of columns; and
the expansion control component comprises:
a write control component to configure the write driver to drive a specified opposite logic value pair on bit lines of a bit line pair associated with the select column responsive to the expansion mode signal representing the non-expansion mode.

3. The memory device of claim 2, wherein:
the access components include a precharge circuit for the bit line pair; and
the expansion control component comprises:
a bit line precharge component to disable the precharge circuit responsive to the expansion mode signal representing the non-expansion mode.

4. The memory device of claim 3, wherein:
the access components include a sense amplifier associated with the bit line pair; and
the expansion control component comprises:
a sense amplifier enable control component to disable the sense amplifier responsive to the expansion mode signal representing the non-expansion mode.

5. The memory device of claim 1, wherein:
the access components include a precharge circuit for a bit line pair associated with a select column of the second subset; and
the expansion control component comprises:
a bit line precharge component to disable the precharge circuit responsive to the expansion mode signal representing the non-expansion mode.

6. The memory device of claim 1, wherein the mode set component is configured to set the expansion mode signal based on a state of at least one of: a signal on an external pin of a device implementing the memory device; a fuse of a device implementing the memory device; and a programmable storage component of a device implementing the memory device.

7. The memory device of claim 1, wherein the bit cells of the array comprise static random access memory (SRAM) bit cells.

8. A system on a chip (SoC) implementing the memory device of claim 1, wherein the mode set component is configured to set the expansion mode signal based on a state of an external pin of the SoC.

9. A method for operating a memory device, the method comprising:
initiating an access operation to a corresponding row of an array of bit cells of the memory device;
responsive to an expansion mode signal having a first state, dynamically operating each column of a plurality of columns of the array to access each bit cell of a corresponding row within the plurality of columns during the access operation; and
responsive to the expansion mode signal having a second state different than the first state:
dynamically operating each column of a first subset of columns of the plurality of columns to access each bit cell of a corresponding row within the first subset of columns during the access operation; and
maintaining each column of a second subset of columns of the plurality of columns in a static state during the access operation.

10. The method of claim 9, further comprising:
setting the expansion mode signal to one of the first state or the second state based on a state of at least one of:
a signal on an external pin of a device implementing the memory device; a fuse; and a programmable storage component.

11. The method of claim 9, wherein:
dynamically operating each column of the plurality of columns to access each bit cell of the corresponding row comprises:
enabling a bit line precharge circuit for each column of the plurality of columns; and
configuring a write driver for each column of the plurality of columns to drive a bit line pair for the column according to a write data bit intended for the column;
dynamically operating each column of the first subset of columns of the plurality of columns to access each bit cell of a corresponding row within the first subset of columns comprises:
enabling a bit line precharge circuit for each column of the first subset of columns; and
configuring a write driver for each column of the first subset of columns to drive a bit line pair for the column according to a write data bit intended for the column.

12. The method of claim 11, wherein:
maintaining each column of a second subset of columns of the plurality of columns in a static state comprises:
disabling a bit line precharge circuit for each column of the second subset of columns; and
configuring a write driver for each column of the second subset of columns to drive a specified opposite logic value pair on bit lines of a bit line pair for the column.

13. The method of claim 12, wherein:
maintaining each column of a second subset of columns of the plurality of columns in a static state further comprises:
disabling a sense amplifier associated with each column of the second subset of columns.

14. A controller of a memory device employing an array of bit cells including at least one default column of bit cells and at least one expansion column of bit cells, controller comprising:
a mode set component configured to provide an expansion mode signal configurable to represent one of a non-expansion mode and an expansion mode; and
a plurality of sub-components configured to receive the expansion mode signal and, in response to the expansion mode signal representing the non-expansion mode, maintain the expansion column of bit cells in a static state during access operations to the array or, in response to the expansion mode signal representing the expansion mode, operate both the default and expansion columns of bit cells.

15. The controller of claim 14, wherein the plurality of sub-components includes a write control component configured to drive a specified opposite logic value pair on bit lines of a bit line pair associated with the expansion column responsive to the expansion mode signal representing the non-expansion mode.

16. The controller of claim 15, wherein the plurality of sub-components includes a bit line precharge (BLPC) control component configured to receive the expansion mode signal and to disable a precharge component from precharging the bit line pair associated with the expansion column in response to the expansion mode signal representing the non-expansion mode.

17. The controller of claim 16, wherein the plurality of sub-components includes a sense amplifier enable (SAEN) control component configured to disable a sense amplifier associated with the expansion column in response to the expansion mode signal representing the non-expansion mode.

18. The controller of claim 17, wherein the sense amplifier is configured to sense voltages on the bit line pair associated with the expansion column in response to a read operation.

19. The controller of claim 14, wherein the mode set component configures the expansion mode signal based on a state of at least one of: a signal on an external pin of a device implementing the memory device; a fuse of a device implementing the memory device; and a programmable storage component of a device implementing the memory device.

20. The controller of claim 14, wherein the bit cells of the array comprise static random access memory (SRAM) bit cells.

* * * * *